US012573332B2

(12) United States Patent
Kuo et al.

(10) Patent No.: US 12,573,332 B2
(45) Date of Patent: Mar. 10, 2026

(54) DISPLAY DEVICE AND METHOD FOR OPERATING DISPLAY DEVICE

(71) Applicant: InnoLux Corporation, Miao-Li County (TW)

(72) Inventors: Shu-Ming Kuo, Miao-Li County (TW); Tsau-Hua Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/741,856

(22) Filed: Jun. 13, 2024

(65) Prior Publication Data

US 2025/0022406 A1     Jan. 16, 2025

(30) Foreign Application Priority Data

Jul. 10, 2023     (CN) .......................... 202310836211.8

(51) Int. Cl.
| | |
|---|---|
| *G09G 3/32* | (2016.01) |
| *H01L 25/16* | (2023.01) |
| *H10H 20/855* | (2025.01) |
| *H10H 29/30* | (2025.01) |
| *H10H 29/851* | (2025.01) |

(52) U.S. Cl.
CPC ............. *G09G 3/32* (2013.01); *H01L 25/167* (2013.01); *H10H 20/855* (2025.01); *G09G 2320/0613* (2013.01); *G09G 2320/0686* (2013.01); *G09G 2320/08* (2013.01); *G09G 2358/00* (2013.01); *H10H 29/30* (2025.01); *H10H 29/8513* (2025.01)

(58) Field of Classification Search
CPC .... G09G 3/32; G09G 3/3208; G09G 2320/06; G09G 2320/0613; G09G 2320/0686; G09G 2320/08; G09G 2358/00; H01L 25/167; H10H 20/855; H10H 29/30; H10H 29/8513
USPC ......................................................... 345/694
See application file for complete search history.

(56) References Cited

U.S. PATENT DOCUMENTS

| | | | | |
|---|---|---|---|---|
| 11,582,440 B2 * | 2/2023 | Do | ........................... | G09G 3/003 |
| 2007/0018915 A1 * | 1/2007 | Tang | ..................... | H10K 59/351 345/76 |
| 2013/0161595 A1 * | 6/2013 | Kim | ....................... | H10K 50/80 257/89 |
| 2016/0170700 A1 * | 6/2016 | Olmo | .................... | G06F 3/0488 345/1.1 |
| 2018/0157083 A1 * | 6/2018 | Yeo | .................. | G02F 1/133514 |

(Continued)

FOREIGN PATENT DOCUMENTS

| | | |
|---|---|---|
| CN | 106653802 | 5/2017 |
| EP | 3 499 493 | 6/2019 |
| WO | 2022/172981 A1 | 8/2022 |

*Primary Examiner* — Jason M Mandeville
(74) *Attorney, Agent, or Firm* — Winston Hsu

(57)     ABSTRACT

The present disclosure provides a display device and a method for operating the display device. The display device includes a night vision mode and a normal mode, and the display device includes a plurality of visible light display units and a plurality of invisible light display units. The method includes driving the visible light display units and turning off the invisible light display units in the normal mode, and driving the invisible light display units and turning off the visible light display units in the night vision mode.

7 Claims, 13 Drawing Sheets

(56)    References Cited

U.S. PATENT DOCUMENTS

2020/0219947 A1      7/2020  Yang
2022/0180807 A1*     6/2022  Xu ........................ G09G 3/3208
2024/0122042 A1*     4/2024  Sudo .................... H10K 50/852

* cited by examiner

DISPLAY DEVICE AND METHOD FOR OPERATING DISPLAY DEVICE

BACKGROUND OF THE DISCLOSURE

1. Field of the Disclosure

The present disclosure relates to a display device and a method for operating a display device and particularly relates to a display device including invisible light display unit and a method for operating the display device.

2. Description of the Prior Art

As the technology of display devices progresses, applications of the display devices become more and more widespread. However, the display device of the prior art only displays visible light images capable of being viewed by naked eye. In order to provide the display device with privacy, the viewing angle of the display device has been reduced to avoid non-users viewing private information. Accordingly, complete privacy in the display device cannot be achieved. In another case, as used in a dark environment, visible light generated from the display device is noticeable to eyes, which will expose the position of user. Therefore, the user is unable to view image information while maintaining secrecy.

SUMMARY OF THE DISCLOSURE

An objective of the present disclosure is to provide a display device and a method for operating the display device.

According to an embodiment, the present disclosure provides a method for operating a display device including a night vision mode and a normal mode. The display device includes a plurality of visible light display units and a plurality of invisible light display units. The method includes driving the visible light display units and turning off the invisible light display units in the normal mode, and driving the invisible light display units and turning off the visible light display units in the night vision mode.

According to another embodiment, the present disclosure provides a display device including a substrate, a plurality of visible light display units, and a plurality of invisible light display units. The visible light display units and the invisible light display units are disposed on the substrate, in which the visible light display units are configured to display a visible image, and the invisible light display units are configured to display an invisible image. The display device has a display region, and the visible light display units and the invisible light display units are disposed in the display region. The display device includes a night vision mode and a normal mode. In the night vision mode, the invisible light display units display the invisible image, and the visible light display units are turned off. In the normal mode, the visible light display units display the visible image, and the invisible light display units are turned off.

These and other objectives of the present disclosure will no doubt become obvious to those of ordinary skill in the art after reading the following detailed description of the embodiment that is illustrated in the various figures and drawings.

DETAILED DESCRIPTION

Figure 1:
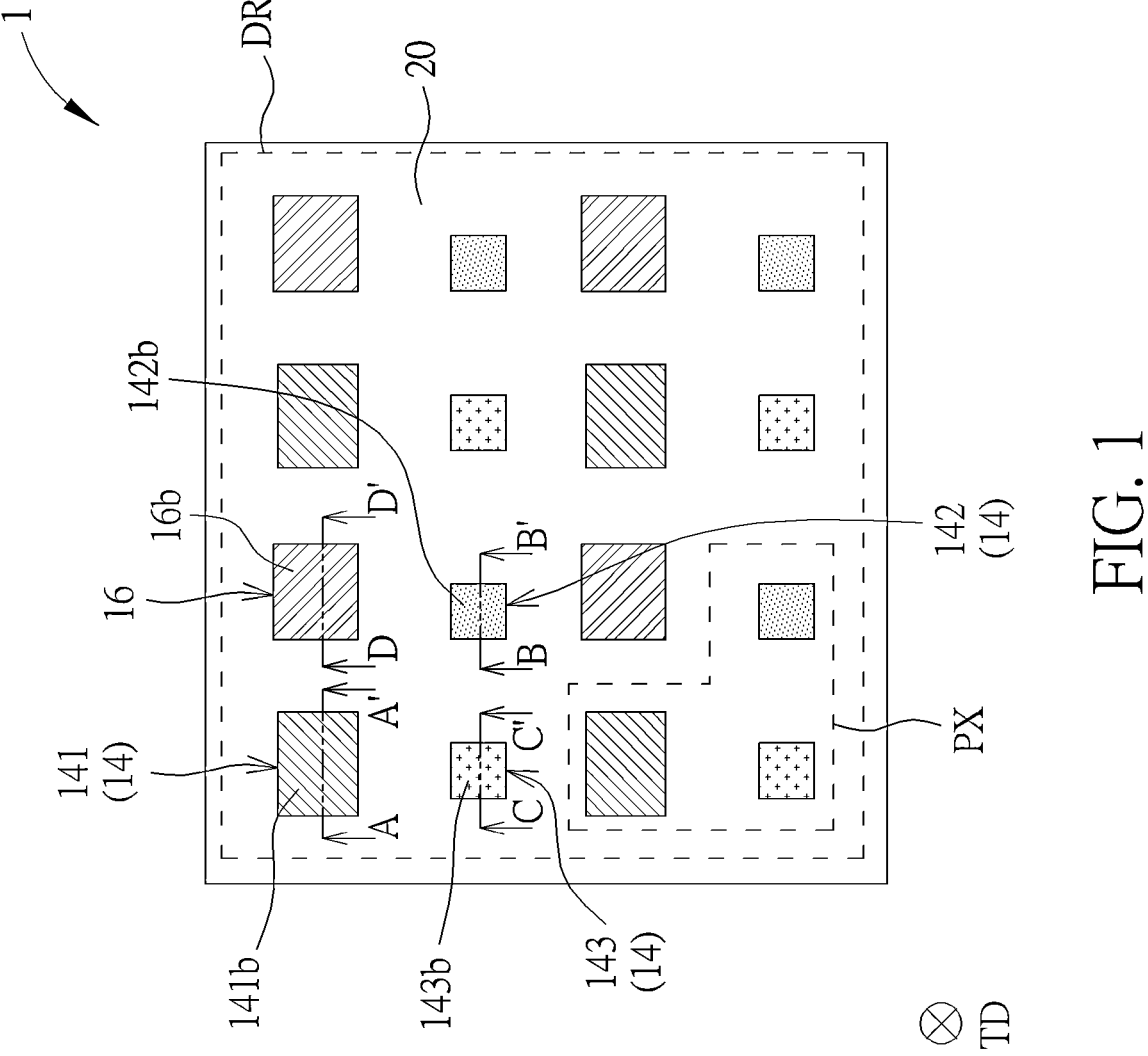
FIG. 1 schematically illustrates a top view of a display device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name.

In addition, when one element or layer is "electrically connected to" the another element or layer, it may be understood that the element or layer is directly electrically connected to the another element or layer, and alternatively, the element or layer is (indirectly) electrically connected to the another element or layer through another element or layer. On the contrary, when the element or layer is "directly electrically connected to" the another element or layer, it may be understood that the element or layer is electrically connected to the another element or layer without through any other intervening element or layer. Also, the term "electrically connected" or "coupled" includes means of direct or indirect electrical connection.

As disclosed herein, the terms "approximately", "essentially", "about", or "substantially" generally mean within 20%, 10%, 5%, 3%, 2%, 1%, or 0.5% of the reported numerical value or range. The quantity disclosed herein is an approximate quantity, that is, without a specific description of "approximately", "essentially", "about", or "substantially", the quantity may still include the meaning of "approximately", "essentially", "about", or "substantially".

It should be understood that according to the following embodiments, features of different embodiments may be replaced, recombined, or mixed to constitute other embodiments without departing from the spirit of the present disclosure. The features of various embodiments may be mixed arbitrarily and used in different embodiments without departing from the spirit of the present disclosure or conflicting.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

The display device of the present disclosure may be applied to, for example, notebooks, public displays, tiled displays, car displays, touch displays, televisions, monitors, smart phones, tablets, light source modules, lighting equipment, military equipment or electronic devices applied to the above products, but not limited thereto. The display device may include, for example, a light emitting diode (LED), a fluorescent material, a phosphor material, other suitable display media or combinations thereof, but not limited thereto. The LED may include, for example, an organic light emitting diode (OLED), a mini light emitting diode (mini-LED) or a micro light emitting diode (micro-LED), a quantum dot light emitting diode (e.g., QLED or QDLED), or any other suitable material or any combination of materials mentioned above, but not limited thereto. The display device may for example include a tiled display device, but not limited thereto. Furthermore, the appearance of the display device may be, for example, a rectangular, circular or polygonal shape, a shape with a curved edge, a curved shape or any other suitable shape. The display device may have peripheral systems, such as a drive system, a control system, a light source system, a shelf system, etc. The display device may include an electronic unit, in which the electronic unit may include passive elements and active elements, such as capacitors, resistors, inductors, diodes, transistors, sensors, and the like.

Figure 2:
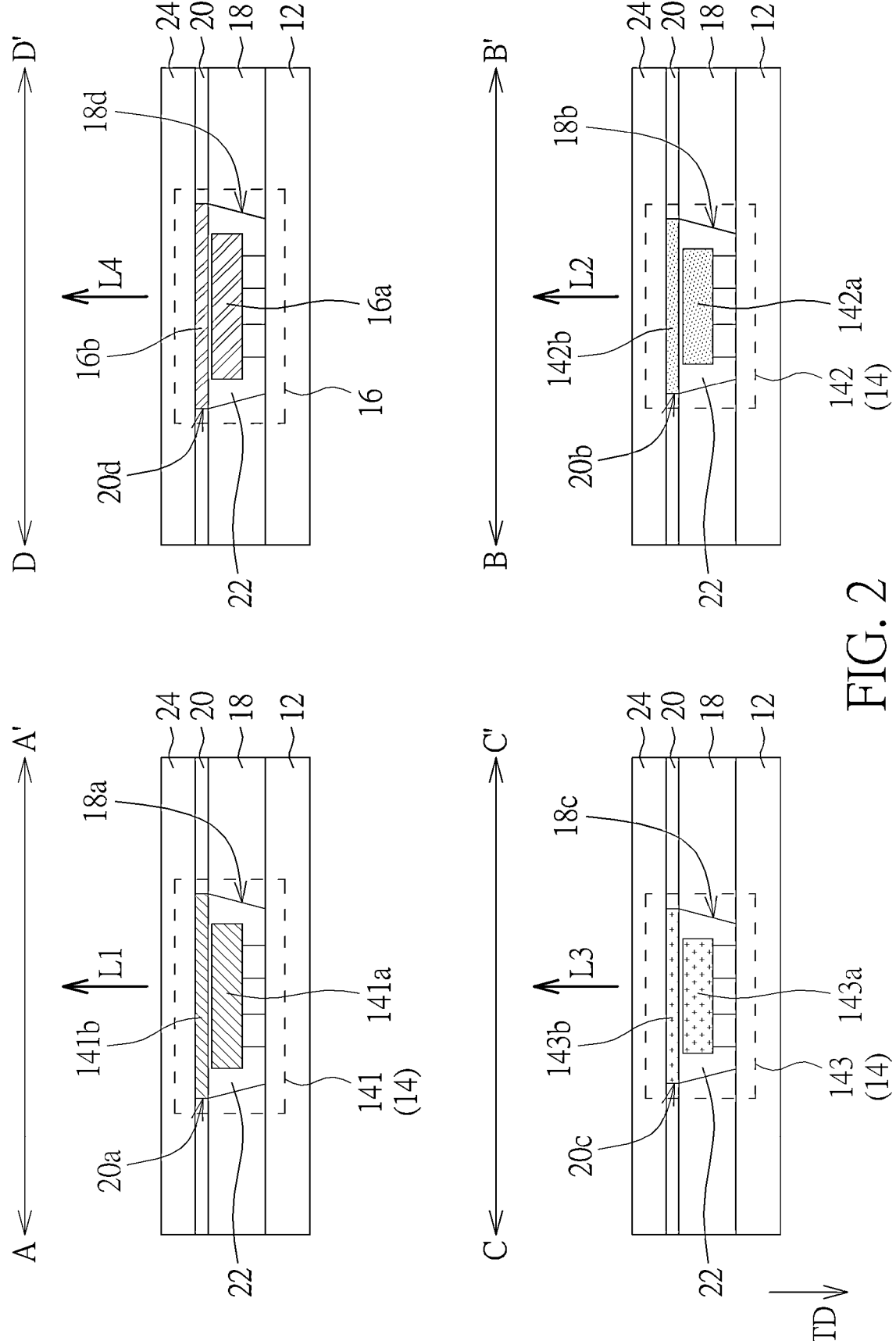
FIG. 2 schematically illustrates cross-sectional views of FIG. 1 taken along a sectional line A-A', a sectional line B-B', a sectional line C-C' and a sectional line D-D', respectively.

Refer to FIG. 1 and FIG. 2. FIG. 1 schematically illustrates a top view of a display device according to a first embodiment of the present disclosure, and FIG. 2 schematically illustrates cross-sectional views of FIG. 1 taken along a sectional line A-A', a sectional line B-B', a sectional line C-C' and a sectional line D-D' respectively. As shown in FIG. 1 and FIG. 2, the display device 1 may include a substrate 12, a plurality of visible light display units 14 and a plurality of invisible light display units 16, in which the visible light display units 14 and the invisible light display units 16 are disposed on the substrate 12. The visible light display units 14 may be configured to display a visible light image, and the invisible light display units 16 may be configured to display an invisible light image. For example, the display device 1 may have a display region DR for displaying images, and the visible light display units 14 and the invisible light display units 16 may be separately disposed in the display region DR of the display device 1 or be distributed in the display region DR of the display device 1.

Specifically, the display device 1 may include a night vision mode and a normal mode. In the night vision mode, the invisible light display units 16 display the invisible light image, and the visible light display units 14 are turned off. In the normal mode, the visible light display units 14 display the visible light image, and the invisible light display units 16 are turned off. Since the display device 1 displays the invisible light image in the night vision mode, bystanders who are not using the display device 1 will not notice that the display device 1 is operating or displaying images. Accordingly, the display device 1 has privacy. In a dark environment, the invisible light image generated from the display device 1 is not recognized by eyes, so that the position of user will not be exposed. Therefore, the user may view the image information while maintaining secrecy. In the present disclosure, when the display device displays the invisible light image, the user needs to wear a device capable of viewing the invisible light image, such as a night vision device (e.g., a night vision device 100 shown in FIG. 12 or FIG. 13) or other suitable devices.

As shown in FIG. 1 and FIG. 2, the visible light display units 12 may include, for example, a first visible light display unit 141, a second visible light display unit 142, and a third visible light display unit 143, which are configured to generate light of different colors, such as light L1, light L2 and light L3, respectively. A peak wavelength of the light L2 generated from the first visible light display unit 141 may be greater than a peak wavelength of the light L2 generated from the second visible light display unit 142, and the peak wavelength of the light L2 generated from the second visible light display unit 142 may be greater than a peak wavelength of the light L3 generated from the third visible light display unit 143. For example, the light L1, the light L2 and the light L3 may be red light, green light, and blue light, respectively, or other combinations of light of suitable colors, but the present disclosure is not limited thereto.

In addition, the invisible light display units 16 may be configured to generate invisible light L4, such as infrared light or other suitable invisible light. Furthermore, a peak wavelength of the light L4 generated from the invisible light display unit 16 is greater than the peak wavelengths of the light (e.g., the light L1, the light L2, and the light L3) generated from the visible light display units 14. The peak wavelength of light L4 may range, for example, from 800 nanometers (nm) to 1500 nanometers.

Figure 11:
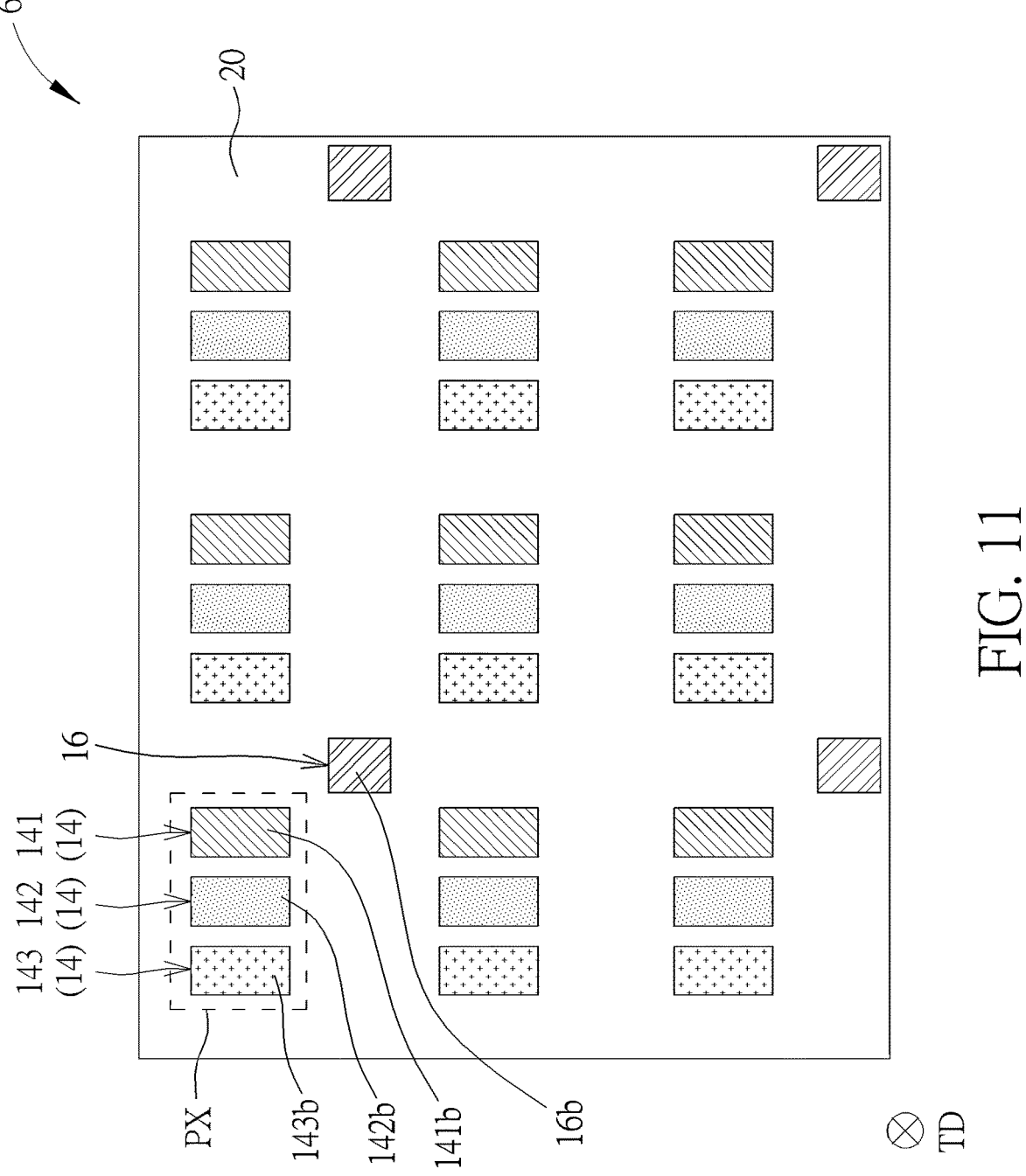
FIG. 11 schematically illustrates a top view of a display device according to a sixth embodiment of the present disclosure.

Moreover, the first visible light display unit 141, the second visible light display unit 142, and the third visible light display unit 143 may form a pixel PX, but not limited thereto. Each of the number of the first visible light display unit 141, the number of the second visible light display unit 142, and the number of the third visible light display unit 143 may, for example, be plural, so as to form a plurality of pixels PX. In the embodiment of FIG. 1, one of the invisible light display units 16 may correspond to one of the pixels PX and be disposed adjacent to the corresponding pixel PX, so that a distribution density of the pixels PX may be equal to a distribution density of the invisible light display units 16, but not limited thereto. In some embodiments, one of the invisible light display units 16 may correspond to plural pixels PX; that is to say, the distribution density of the pixels PX may be greater than the distribution density of the invisible light display units 16, e.g., as shown in FIG. 11, but not limited thereto. In one of the pixels PX of FIG. 1, the first visible light display unit 141, the second visible light display unit 142, the third visible light display unit 143, and the corresponding invisible light display unit 16 may be arranged as an array, but not limited thereto. In some embodiments, the arrangement of the first visible light display unit 141, the second visible light display unit 142, the third visible light display unit 143, and the corresponding invisible light display unit 16 may be adjusted according to requirements.

As shown in FIG. 2, the first visible light display unit 141 may include a first light emitting element 141a, the second visible light display unit 142 may include a second light emitting element 142a, the third visible light display unit 143 may include a third light emitting element 143a, and one of the non-visible light display units 16 may include a fourth light emitting element 16a. In the embodiment of FIG. 2, the first light emitting element 141a, the second light emitting element 142a, and the third light emitting element 143a may generate light of different colors. A peak wavelength of the light generated from the fourth light emitting element 16a may be greater than a peak wavelength of the light generated from the first light emitting element 141a. The peak wavelength of the light generated from the first light emitting element 141a may be greater than a peak wavelength of the light generated from the second light emitting element 142a. The peak wavelength of the light generated from the second light emitting element 142a may be greater than a peak wavelength of the light generated from the third light emitting element 143a. For example, colors of the light generated from the first light emitting element 141a, the second light emitting element 142a, and the third light emitting element 143a may be respectively close to or the same as the colors of light L1, light L2, and light L3, e.g., red light, green light and blue light, but not limited thereto. The light L1, the light L2, and the light L3 are light finally emitted out from the display device 1. The light generated from the fourth light emitting element 16a may be the same as or similar to the light L4 generated from the invisible light display unit 16, for example may include infrared light or other suitable invisible light. The peak wavelength of the light generated from the fourth light emitting element 16a may range, for example, from 800 nanometers to 1500 nanometers.

Figure 3:
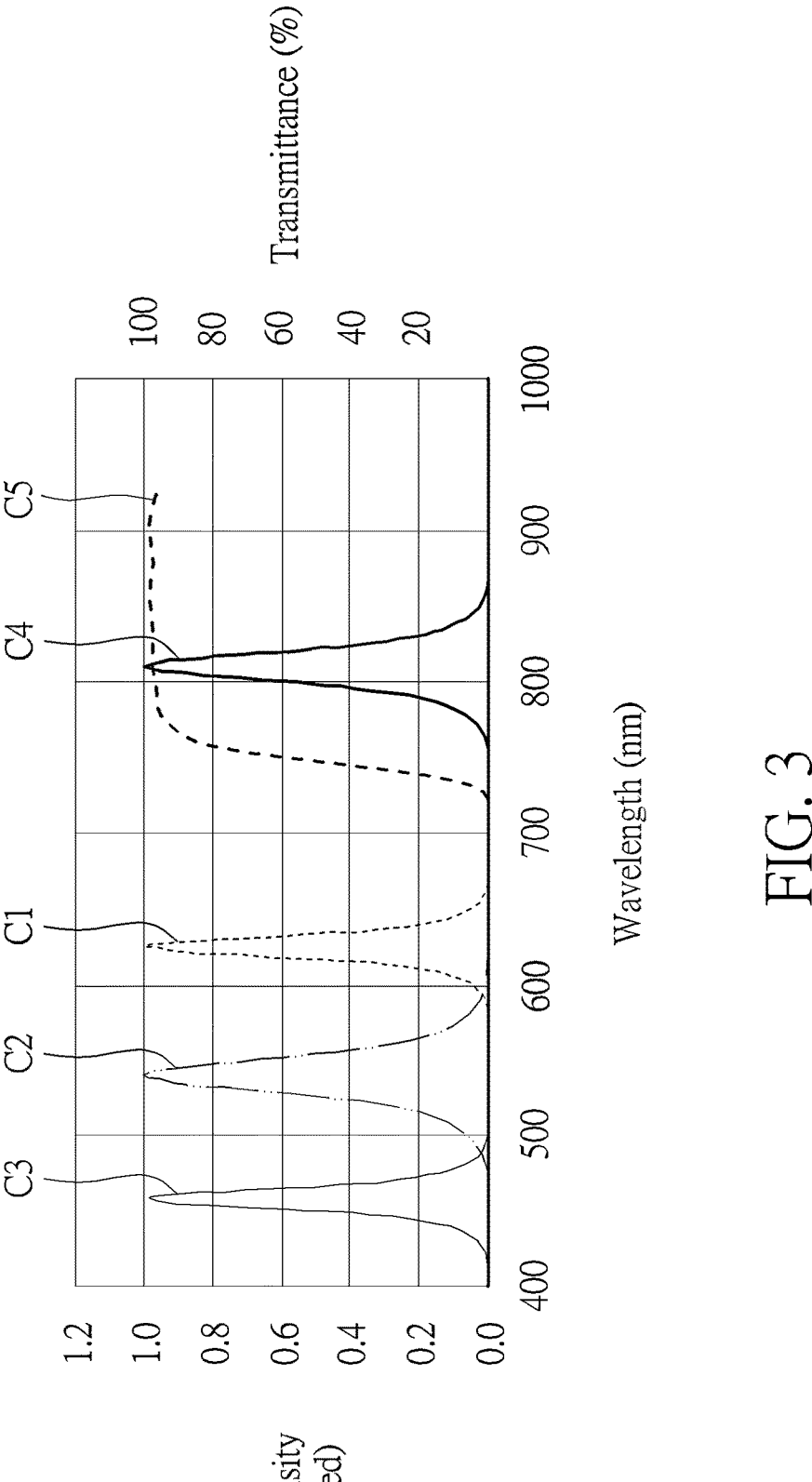
FIG. 3 schematically illustrates emission spectra of the first light emitting element, the second light emitting element, the third light emitting element and the fourth light emitting element and transmission spectrum of a filter layer according to an embodiment of the present disclosure.

Refer to FIG. 3, which schematically illustrates emission spectra of the first light emitting element, the second light emitting element, the third light emitting element, and the fourth light emitting element and a transmission spectrum of a filter layer according to an embodiment of the present disclosure. As shown in FIG. 3, a curve C1, a curve C2, a curve C3, and a curve C4 may represent the emission spectra of the first light emitting element 141a, the second light emitting element 142a, the third light emitting element 143a, and the fourth light emitting element 16a respectively, but not limited thereto. A left ordinate of FIG. 3 represents normalized light intensity of the emission spectra. As can be seen from FIG. 3, the first light emitting element 141a, the second light emitting element 142a, and the third light emitting element 143a may generate light of different colors, but the emission spectra of the light emitting elements in the present disclosure are not limited to FIG. 3.

In the embodiment of FIG. 2, each of the first light emitting element 141a, the second light emitting element 142a, the third light emitting element 143a, and the fourth light emitting element 16a may, for example, include an organic light emitting diode or a light emitting diode (LED) chip, but not limited thereto. The LED chip may include, for example, a sub-millimeter LED (mini LED), a micro LED, or other LEDs with suitable size. In order to generate light of different colors, the materials of the LED chips of the light emitting elements may be different, such that an external quantum efficiency (EQE) of the light emitting element of one of the visible light display units 14 (i.e., an efficiency for converting electrical energy into light energy) may be different from the EQE of the light emitting element of another one of the visible light display units 14, and/or the EQE of the light emitting element of one of the invisible light display units 16 may be different from the EQE of the light emitting element of one of the visible light display units 14. In this embodiment, an area of the light emitting element of one of the visible light display units 14 may be different from an area of the light emitting element of another one of the visible light display units 14, and/or the area of the light emitting element of one of the visible light display units 14 may be different from an area of the light emitting element of one of the invisible light display units 16, so as to improve a whole EQE of the display device 1 or reduce power loss. As mentioned herein, the "area" refers to the light emitting area of the corresponding element when viewed along a direction TD perpendicular to an upper surface of the substrate 12. For example, the area of the light emitting element, the area of the visible light display unit 14 or the area of the invisible light display unit 16 refers to their light emitting area when viewed along the direction TD.

For example, the materials of the LED chips of the first light emitting element 141a and the fourth light emitting element 16a may be different from the materials of the LED chips of the second light emitting element 142a and the third light emitting element 143a. The materials of the LED chips of the first light emitting element 141a and the fourth light emitting element 16a may include, for example, indium gallium arsenide phosphide (InGaAsP) or aluminum gallium indium phosphide (AlGaInP). The materials of the LED chips of the second light emitting element 142a and the third light emitting element 143a may include, for example, indium gallium nitride (InGaN) or gallium nitride (GaN). In this case, the EQE of the first light emitting element 141a and/or the EQE of the fourth light emitting element 16a may be less than the EQE of the second light emitting element 142a and/or the EQE of the third light emitting element 143a.

Figure 4:
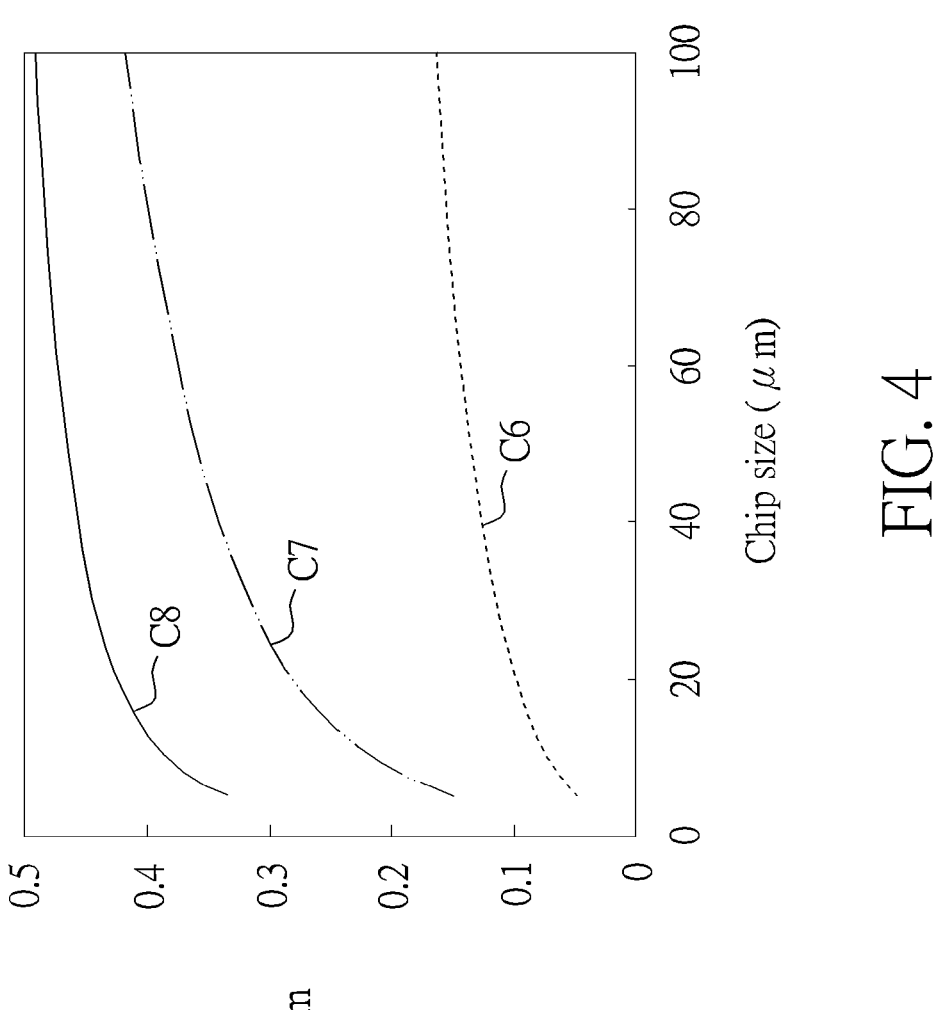
FIG. 4 schematically illustrates relationships between chip sizes and external quantum efficiencies of the first light emitting element, the second light emitting element and the third light emitting element when they are LED chips.

For example, refer to FIG. 4, which schematically illustrates relationships between chip sizes and EQEs of the first light emitting element, the second light emitting element, and the third light emitting element when they are LED chips. As shown in FIG. 2 and FIG. 4, when a relationship among the peak wavelengths of the light generated from the first light emitting element 141a, the second light emitting element 142a, and the third light emitting element 143a is as described above, the curve C6, the curve C7, and the curve C8 may respectively represent a relationship between the chip size and EQE of the first light emitting element 141a, a relationship between the chip size and EQE of the second light emitting element 142a, and a relationship between the chip size and EQE of the third light emitting element 143a. As can be seen from FIG. 4, when the first light emitting element 141a, the second light emitting element 142a, and the third light emitting element 143a have the same chip size, the EQE of the first light emitting element 141a is less than the EQE of the second light emitting element 142a and the EQE of the third light emitting element 143a. In particular, when the chip size of the first light emitting element 141a is less than 20 microns (μm), its EQE is significantly lower. In FIG. 4, the chip size may, for example, refer to a length of a diagonal line of the LED chip in a top view, and therefore, the chip size may represent the light emitting area of the LED chip, but not limited thereto. In this embodiment, the area of the first light emitting element 141a may be greater than the area of the second light emitting element 142a and the area of the third light emitting element 143a, so that the EQE of the first light emitting element 141a may be improved to reduce overall power loss. Alternatively, when the first light emitting element 141a needs a smaller chip size, the above configuration may help to increase the manufacturing yield of the first light emitting element 141a. In some embodiments, the first light emitting element 141a, the second light emitting element 142a, the third light emitting element 143a, and the fourth light emitting element 16a may include other types of light emitting elements, such as organic light emitting diodes, quantum dot light emitting diodes or other suitable elements.

In some embodiments, the area of the fourth light emitting element 16a may be greater than the area of the second light emitting element 142a and the area of the third light emitting element 143a, such that the EQE of the fourth light emitting element 16a may be improved to reduce the overall power loss, or the manufacturing yield of the fourth light emitting element 16a may be improved.

As shown in FIG. 2, the first visible light display unit 141 may further include a first color filter layer 141b disposed on the first light emitting element 141a. The second visible light display unit 142 may further include a second color filter layer 142b disposed on the second light emitting element 142a. The third visible light display unit 143 may further include a third color filter layer 143b disposed on the third light emitting element 143a. One of the invisible light display units 16 may further include a filter layer 16b disposed on the fourth light emitting element 16a. The first color filter layer 141b, the second color filter layer 142b, the third color filter layer 143b, and the filter layer 16b may have different transmission spectra, so that light with different peak wavelengths generated from the first light emitting element 141a, the second light emitting element 142a, the third light emitting element 143a, and the fourth light emitting element 16a is able to pass through the first color filter layer 141b, the second color filter layer 142b, the third color filter layer 143b, and the filter layer 16b respectively.

As shown in FIG. 3, the transmission spectra of the corresponding first color filter layer 141b, the corresponding second color filter layer 142b, and the corresponding third color filter layer 143b may be designed respectively according to the emission spectra of the first light emitting element 141a, the second light emitting element 142a, and the third light emitting element 143a. Also, the curve C5 represents the transmission spectrum of the filter layer 16b, where a right ordinate of FIG. 3 represents the transmittance of the transmission spectrum. In the embodiment of FIG. 3, the filter layer 16b may filter out the visible light of the first light emitting element 141a, the second light emitting element 142a, and the third light emitting element 143a and allow the invisible light of the fourth light emitting element 16a to pass. The installation of the color filter layers and the filter layer 16b may reduce the brightness of ambient light reflected from the corresponding visible light display unit 14 or invisible light display unit 16, so as to improve contrast ratio of the display device 1 with ambient light, for example, to increase ambient contrast ratio (ACR).

As shown in FIG. 2, the display device 1 may further include an insulating layer 18 and a light shielding layer 20, which are sequentially disposed on the substrate 12. The insulating layer 18 may be, for example, a pixel defining layer (PDL). The insulating layer 18 may include, for example, a photoresist material, an ink material, or other suitable materials. For example, the insulating layer 18 may be white, gray or black. The light shielding layer 20 may, for example, be black. The light shielding layer 20 may include, for example, a photoresist material, an ink material, or other suitable materials. In some embodiments, the display device 1 may not include the light shielding layer 20, but may include a stack of different color filter layers to form a light shielding structure. The insulating layer 18 may have an opening 18a, an opening 18b, an opening 18c, and an opening 18d, so that grooves may be respectively formed by the opening 18a, the opening 18b, the opening 18c, and the opening 18d in combination with the substrate 12. In this case, at least one first light emitting element 141a may be disposed in each opening 18a; at least one second light emitting element 142a may be disposed in each opening 18b; at least one third light emitting element 143a may be disposed in each opening 18c; and at least one fourth light emitting element 16a may be disposed in each opening 18d. The sizes of the opening 18a, the opening 18b, the opening 18c, and the opening 18d may be adjusted according to the sizes of the corresponding light emitting elements. In this embodiment, since the area of the first light emitting element 141a and/or the area of the fourth light emitting element 16a may be greater than the area of the second light emitting element 142a and/or the area of the third light emitting element 143a, when viewed along the direction TD, the area of the opening 18a and/or the area of the opening 18d may be greater than the area of the opening 18b and/or the area of the opening 18c.

In addition, the light shielding layer 20 may have an opening 20a, an opening 20b, an opening 20c, and an opening 20d corresponding to the opening 18a, the opening 18b, the opening 18c, and the opening 18d of the insulating layer 18, respectively. The first color filter layer 141b, the second color filter layer 142b, the third color filter layer 143b, and the filter layer 16b may be respectively disposed in the opening 20a, the opening 20b, the opening 20c, and the opening 20d. In this embodiment, the areas of the opening 20a, the opening 20b, the opening 20c, and the opening 20d may be adjusted according to the areas of the opening 18a, the opening 18b, the opening 18c, and the opening 18d for disposing the light emitting elements, so that the area of the opening 20a and/or the area of the opening 20d may be greater than the area of the opening 20b and/or the area of the opening 20c. Moreover, the areas of the first visible light display unit 141, the second visible light display unit 142, the third visible light display unit 143, and the invisible light display unit 16 may be determined by the areas of the opening 20*a*, the opening 20*b*, the opening 20*c*, and the opening 20*d*, respectively, and accordingly, the above configuration may achieve that the area of the first visible light display unit 141 and/or the area of the invisible light display unit 16 is greater than the area of the second visible light display unit 142 and/or the area of the third visible light display unit 143.

In the embodiment of FIG. 2, the display device 1 may include an insulating layer 22 disposed in the opening 18*a*, the opening 18*b*, the opening 18*c*, and the opening 18*d*. The insulating layer 22 may cover the first light emitting element 141*a*, the second light emitting element 142*a*, the third light emitting element 143*a*, and the fourth light emitting element 16*a*. An upper surface of the insulating layer 22 may be leveled with an upper surface of the insulating layer 18, but not limited thereto. The insulating layer 22 may, for example, include an organic material, which may be cured by irradiation or heating to fix the light emitting elements on the substrate 12, but not limited thereto. In some embodiments, an adhesive layer may be further disposed between the insulating layer 18 and the light shielding layer 20. The adhesive layer may include, for example, optically clear adhesive (OCR/OCA).

Furthermore, the display device 1 may further include an encapsulation layer 24 disposed on the light shielding layer 20, the first color filter layer 141*b*, the second color filter layer 142*b*, the third color filter layer 143*b*, and the filter layer 16*b*. The encapsulation layer 24 may, for example, include a single or multiple inorganic material layers or an alternating stack of at least one inorganic material layer and at least one organic material layer to reduce penetration of moisture or oxygen. For example, the inorganic material layer may include silicon nitride, silicon oxide, silicon oxynitride, aluminum oxide, other suitable materials, or any combination of the above inorganic materials, but not limited thereto. The organic material layer may include resin, but not limited thereto.

In this embodiment, the substrate 12 may include a substrate material and active elements formed on the substrate material. The first light emitting element 141*a*, the second light emitting element 142*a*, the third light emitting element 143*a*, and the fourth light emitting element 16*a* may be controlled by corresponding active elements. For example, the substrate material may include a flexible substrate material or a hard substrate material, for example include polyimide (PI), polyethylene terephthalate (PET), polycarbonate (PC), polyethersulfone (PES), polybutylene terephthalate (PBT), polyethylene naphthalate (PEN), polyarylate (PAR), acrylic, glass and quartz, sapphire, other suitable materials, or any combination thereof, but not limited thereto. The active element may include a thin film transistor, but not limited thereto. In some embodiments, the encapsulation layer 24 may include the substrate material exemplified above.

In some embodiments, the encapsulation layer 24 of the display device 1 may be replaced by another substrate. In this case, the light shielding layer 20, the first color filter layer 141*b*, the second color filter layer 142*b*, the third color filter layer 143*b*, and the filter layer 16*b* may be formed on the another substrate and then be bonded to the insulating layer 18 and the insulating layer 22 through the adhesive layer, but not limited thereto.

The display device of the present disclosure is not limited to the above embodiments and may include other embodiments. To simplify the description, other embodiments will be labeled with the same reference numerals as the first embodiment. In order to easily compare the differences between the first embodiment and other embodiments, the differences between different embodiments will be mentioned below, and repeated parts will not be described redundantly.

Figure 5:
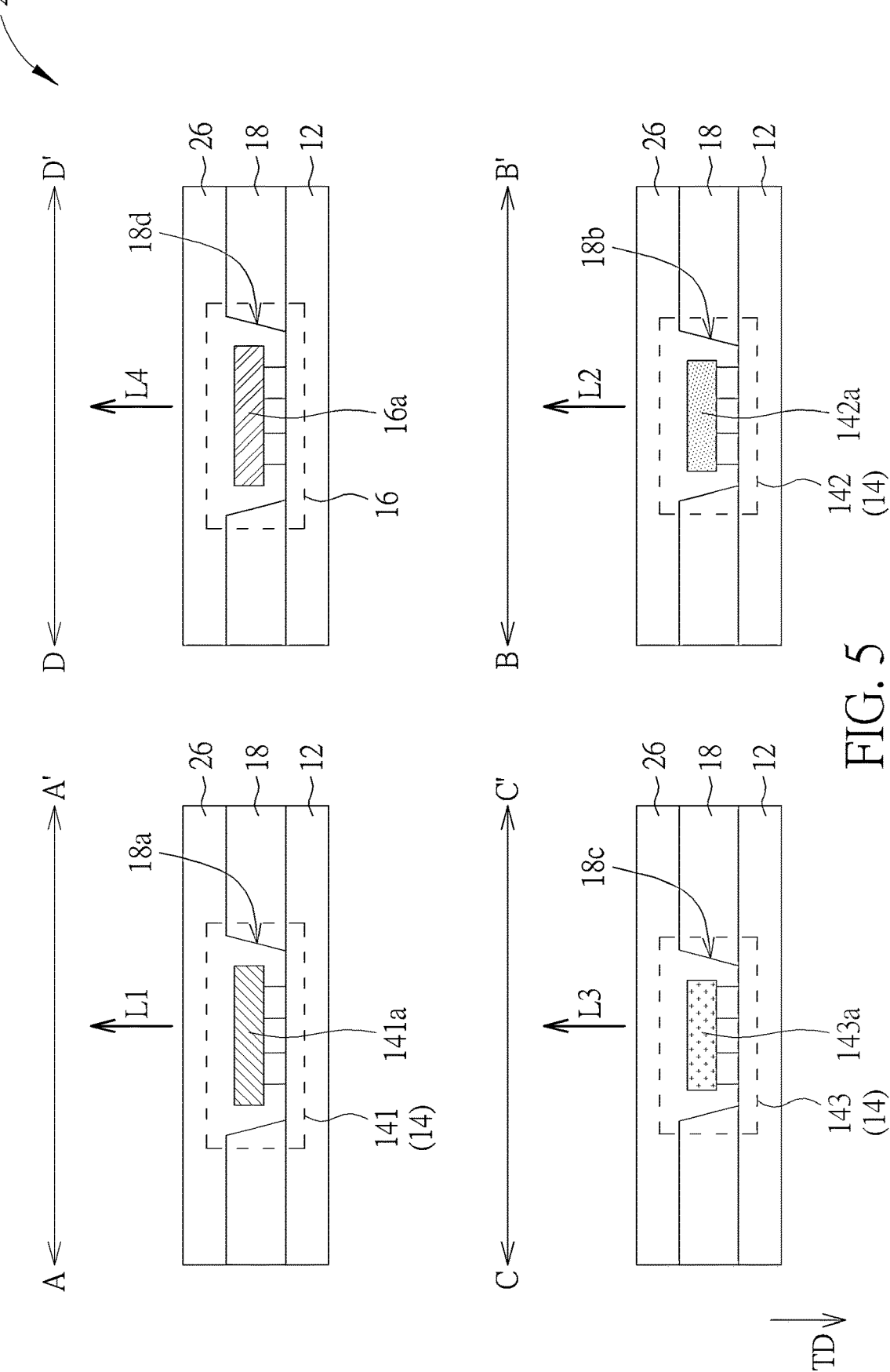
FIG. 5 schematically illustrates cross-sectional views of portions of the display device respectively corresponding to the sectional line A-A', the sectional line B-B', the sectional line C-C' and the sectional line D-D' of FIG. 1 according to a second embodiment of the present disclosure.

Refer to FIG. 5, which schematically illustrates cross-sectional views of portions of the display device respectively corresponding to the sectional line A-A', the sectional line B-B', the sectional line C-C' and the sectional line D-D' of FIG. 1 according to a second embodiment of the present disclosure. As shown in FIG. 5, the display device 2 provided in this embodiment may further include a protection layer 26 disposed on the first light emitting element 141*a*, the second light emitting element 142*a*, the third light emitting element 143*a*, and the fourth light emitting element 16*a*. In the embodiment of FIG. 5, the display device 2 may optionally not include the insulating layer 22, the light shielding layer 20, the color filter layers, the filter layer 16*b*, and the encapsulation layer 24 as shown in FIG. 1, such that the protection layer 26 may be directly disposed in the opening 18*a*, the opening 18*b*, the opening 18*c*, and the opening 18*d* of the insulating layer 18 to protect the first light emitting element 141*a*, the second light emitting element 142*a*, the third light emitting element 143*a*, and the fourth light emitting element 16*a*. In this case, the protection layer 26 may, for example, include a gray or black material, which may include, for example, an organic material with carbon black added therein, titanium dioxide ($TiO_2$) or a combination thereof, so that the protection layer 26 may further have a function of reducing visibility of the first light emitting element 141*a*, the second light emitting element 142*a*, the third light emitting element 143*a*, and the fourth light emitting element 16*a*. The material of the protection layer 26 may include, for example, a photoresist material, silica gel, epoxy resin glue or other suitable materials. In addition, other portions of the display device 2 shown in FIG. 5 may be the same as or similar to the display device of the above embodiment and will not be described again.

Figure 6:
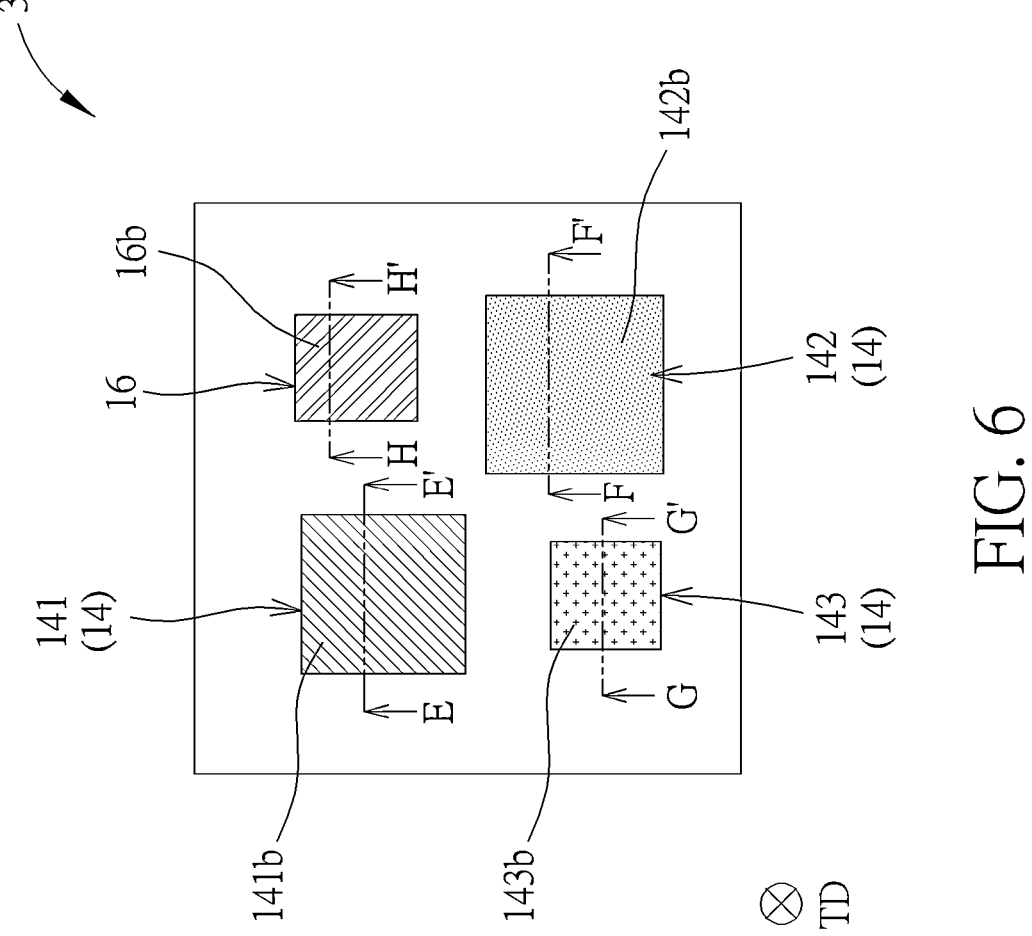
FIG. 6 schematically illustrates a top view of a display device according to a third embodiment of the present disclosure.
Figure 7:
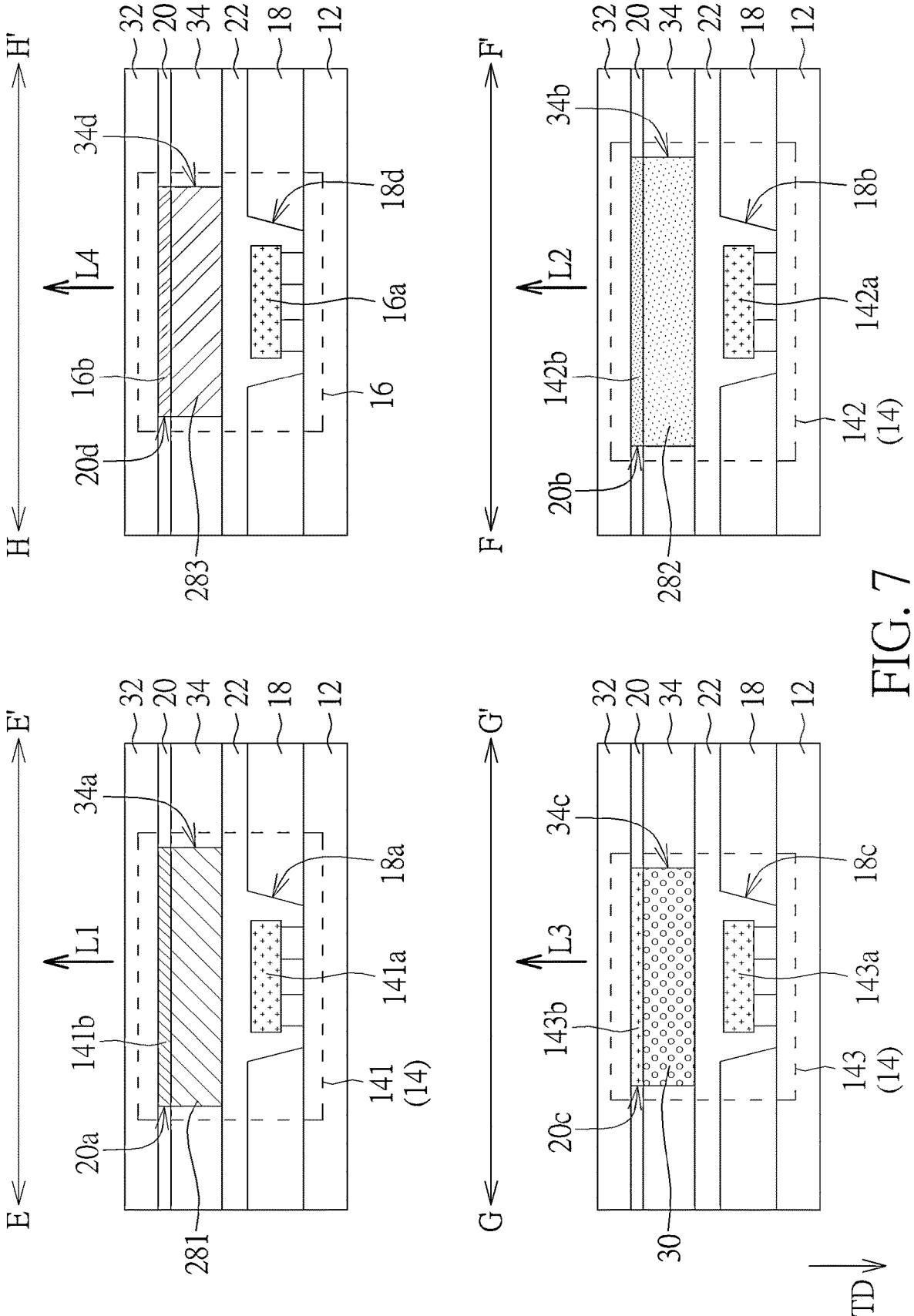
FIG. 7 schematically illustrates cross-sectional views of FIG. 6 taken along a sectional line E-E', a sectional line F-F', a sectional line G-G' and a sectional line H-H' respectively.

Refer to FIG. 6 and FIG. 7. FIG. 6 schematically illustrates a top view of a display device according to a third embodiment of the present disclosure, and FIG. 7 schematically illustrates cross-sectional views of FIG. 6 taken along a sectional line E-E', a sectional line F-F', a sectional line G-G', and a sectional line H-H' respectively. As shown in FIG. 6 and FIG. 7, in the display device 3 provided in this embodiment, the first light emitting element 141*a*, the second light emitting element 142*a*, the third light emitting element 143*a*, and the fourth light emitting element 16*a* may be the same as each other and generate the same emission spectrum. In other words, the first light emitting element 141*a*, the second light emitting element 142*a*, the third light emitting element 143*a*, and the fourth light emitting element 16*a* may generate light of the same color, such as blue light, ultraviolet light or other suitable light. In the embodiment of FIG. 7, the light generated from the third light emitting element 143*a* may serve as the light L3 emitted from the third visible light display unit 143. In this case, the first visible light display unit 141 may further include a first wavelength conversion layer 281 disposed on the first light emitting element 141*a* and configured to convert light from the first light emitting element 141*a* into the light L1 emitted from the first visible light display unit 141. The second visible light display unit 142 may further include a second wavelength conversion layer 282 disposed on the second light emitting element 142*a* and configured to convert light from the second light emitting element 142*a* into the light L2 emitted from the second visible light display unit 142. The invisible light display unit 16 may further include a third wavelength conversion layer 283 disposed on the fourth light emitting element 16a and configured to convert light from the fourth light emitting element 16a into invisible light L4 emitted from the invisible light display unit 16. Therefore, the first wavelength conversion layer 281, the second wavelength conversion layer 282, and the third wavelength conversion layer 283 may be configured to generate light of different peak wavelengths, respectively. In addition, the third visible light display unit 143 may optionally include a light scattering layer 30 disposed on the third light emitting element 143a and configured to scatter the light from the third light emitting element 143a to increase the beam angle of the light L3. The present disclosure is not limited thereto.

In some embodiments, when the color of the light generated from the third light emitting element 143a is different from the color of the light L3 emitted from the third visible light display unit 143, the third visible light display unit 143 may optionally include a fourth wavelength conversion layer disposed on the third light emitting element 143a and configured to convert the light from the third light emitting element 143a into the light L3 emitted from the third visible light display unit 143.

It should be noted that since the first light emitting element 141a, the second light emitting element 142a, the third light emitting element 143a, and the fourth light emitting element 16a may generate light of the same color, and for example, they are all the same LED chips, it is not necessary to perform a mass transferring process several times to disposing light emitting elements of different colors during disposing the first light emitting element 141a, the second light emitting element 142a, the third light emitting element 143a, and the fourth light emitting element 16a respectively in the opening 18a, the opening 18b, the opening 18c, and the opening 18d. Accordingly, manufacturing steps may be simplified, and process difficulty may be reduced.

In order to make different wavelength conversion layers, such as the first wavelength conversion layer 281, the second wavelength conversion layer 282, and the third wavelength conversion layer 283, generate the light L1, the light L2, and the light L4 with different peak wavelengths, the first wavelength conversion layer 281, the second wavelength conversion layer 282, and the third wavelength conversion layer 283 may include different wavelength conversion particles, such as include quantum dot particles of different sizes or materials or other suitable wavelength conversion materials. In some embodiments, at least one of the first wavelength conversion layer 281, the second wavelength conversion layer 282, and the third wavelength conversion layer 283 may optionally include scattering particles disposed therein to enhance light conversion efficiency of the wavelength conversion layer. In some embodiments, when the third visible light display unit 143 includes a fourth wavelength conversion layer, the fourth wavelength conversion layer may include, for example, quantum dot particles or other suitable wavelength conversion materials. The fourth wavelength conversion layer may optionally include scattering particles, but not limited thereto.

In some embodiments, taking the wavelength conversion layer including quantum dot particles as an example, light conversion efficiency of quantum dot particles used to generate the light L2 may be less than light conversion efficiency of quantum dot particles used to generate the light L1 and light conversion efficiency of quantum dot particles used to generate light L4. In order to improve light conversion efficiency of the second wavelength conversion layer 282, the area of the second wavelength conversion layer 282 may be greater than that of the first wavelength conversion layer 281 and that of the third wavelength conversion layer 283, so that the area of the second visible light display unit 142 may be greater than that of the first visible light display unit 141 and that of the invisible light display unit 16, thereby increasing the brightness of the light L2.

In addition, the area of the first wavelength conversion layer 281 and the area of the second wavelength conversion layer 282 may be greater than the area of the light scattering layer 30 (or the fourth wavelength conversion layer), such that the light conversion efficiency of the first wavelength conversion layer 281 and the light conversion efficiency of the second wavelength conversion layer 282 may be improved to increase the brightness of the light L1 and the light L2. In other words, the area of the first visible light display unit 141 and the area of the second visible light display unit 142 may be greater than the area of the third visible light display unit 143. By increasing the area of the second wavelength conversion layer 282 and the area of the first wavelength conversion layer 281, the brightness of the light L2 and the brightness of the light L1 may match the brightness of the light L3 of the third visible light display unit 143. In some embodiments, since there is no need to match the light L4 with the light L3, the area of the third wavelength conversion layer 283 may be adjusted according to requirements, such that the area of the invisible light display unit 16 may be greater than, equal to, or less than the area of the third visible light display unit 143.

In some embodiments, the light scattering layer 30 may include, for example, a polymer layer and light scattering particles disposed in the polymer layer. The light scattering particles may include, for example, titanium dioxide, boron nitride (BN), or other particle materials that have a refractive index different from the polymer layer, but not limited thereto. The polymer layer may, for example, include a scattering material. In some embodiments, other portions of the display device 3 shown in FIG. 6 may be the same as or similar to the display device 1 of the above embodiment and therefore will not be described again.

In the embodiment of FIG. 7, the display device 3 may include a substrate 32 disposed on the light shielding layer 20 and the filter layers (e.g., the first color filter layer 141b, the second color filter layer 142b, the third color filter layer 143b, and the filter layer 16b). In this case, the light shielding layer 20, the filter layers and the wavelength conversion layers may be formed on the substrate 32 first, and then the wavelength conversion layers are attached to the insulating layer 22 through an adhesive layer (not shown), but the present disclosure is not limited thereto. In some embodiments, the substrate 32 may be replaced with the encapsulation layer 24 shown in FIG. 1. In such case, the wavelength conversion layers, the filter layers and the light shielding layer 20 may be formed on the insulating layer 22 first, and then the encapsulation layer 24 is formed on the filter layers and the light shielding layer 20.

In FIG. 7, the display device 3 may optionally include an insulating layer 34 to separate the first wavelength conversion layer 281, the second wavelength conversion layer 282, the third wavelength conversion layer 283, and the light scattering layer 30 (or the fourth wavelength conversion layer) from one another. The insulating layer 34 may have an opening 34a, an opening 34b, an opening 34c, and an opening 34d respectively used to dispose the first wavelength conversion layer 281, the second wavelength conversion layer 282, the third wavelength conversion layer 283, and the light scattering layer 30. In the embodiment of FIG. 7, the sizes of the opening 34a, the opening 34b, the opening 34c, and the opening 34d may be the same as the sizes of the opening 20a, the opening 20b, the opening 20c, and the opening 20d, respectively, such that the sizes of the first wavelength conversion layer 281, the second wavelength conversion layer 282, the third wavelength conversion layer 283, and the light scattering layer 30 may be the same as the sizes of the first color filter layer 141b, the second color filter layer 142b, the third color filter layer 143b, and the filter layer 16b, respectively. In some embodiments, the sizes of the opening 34a, the opening 34b, the opening 34c, and the opening 34d may respectively be different from the sizes of the opening 20a, the opening 20b, the opening 20c, and the opening 20d. In addition, other portions of the display device 3 shown in FIG. 6 and FIG. 7 may be the same as or similar to the display devices of the embodiments described above and will not be repeated.

It is noted that in FIG. 7, the first color filter layer 141b, the second color filter layer 142b, and the filter layer 16b may be respectively disposed on the first wavelength conversion layer 281, the second wavelength conversion layer 282 and the third wavelength conversion layer 283. When the first wavelength conversion layer 281, the second wavelength conversion layer 282 and the third wavelength conversion layer 283 do not absorb all the light generated from the corresponding light emitting elements, the first color filter layer 141b, the second color filter layer 142b, and the filter layer 16b may be respectively used to filter out the light generated from the light emitting elements to prevent the colors of the light L1, the light L2, and the light L4 from being affected by the light from the light emitting elements.

Figure 8:
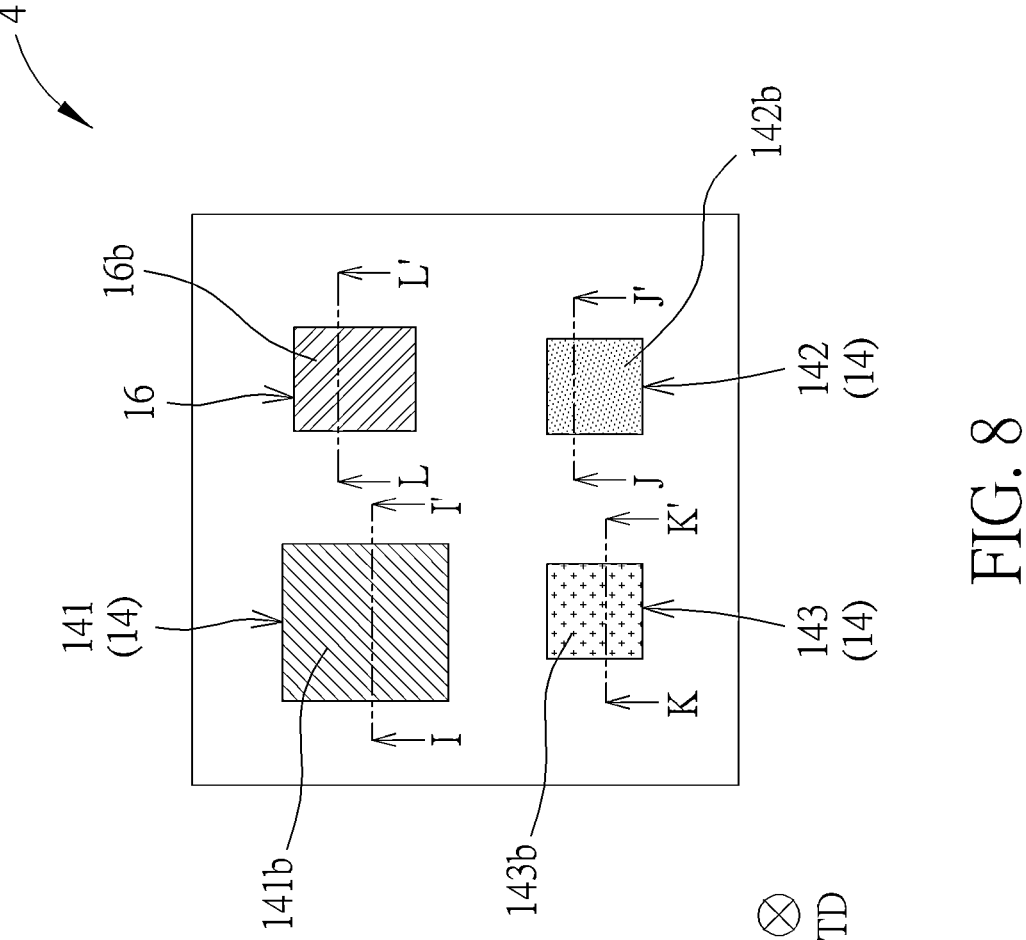
FIG. 8 schematically illustrates a top view of a display device according to a fourth embodiment of the present disclosure.
Figure 9:
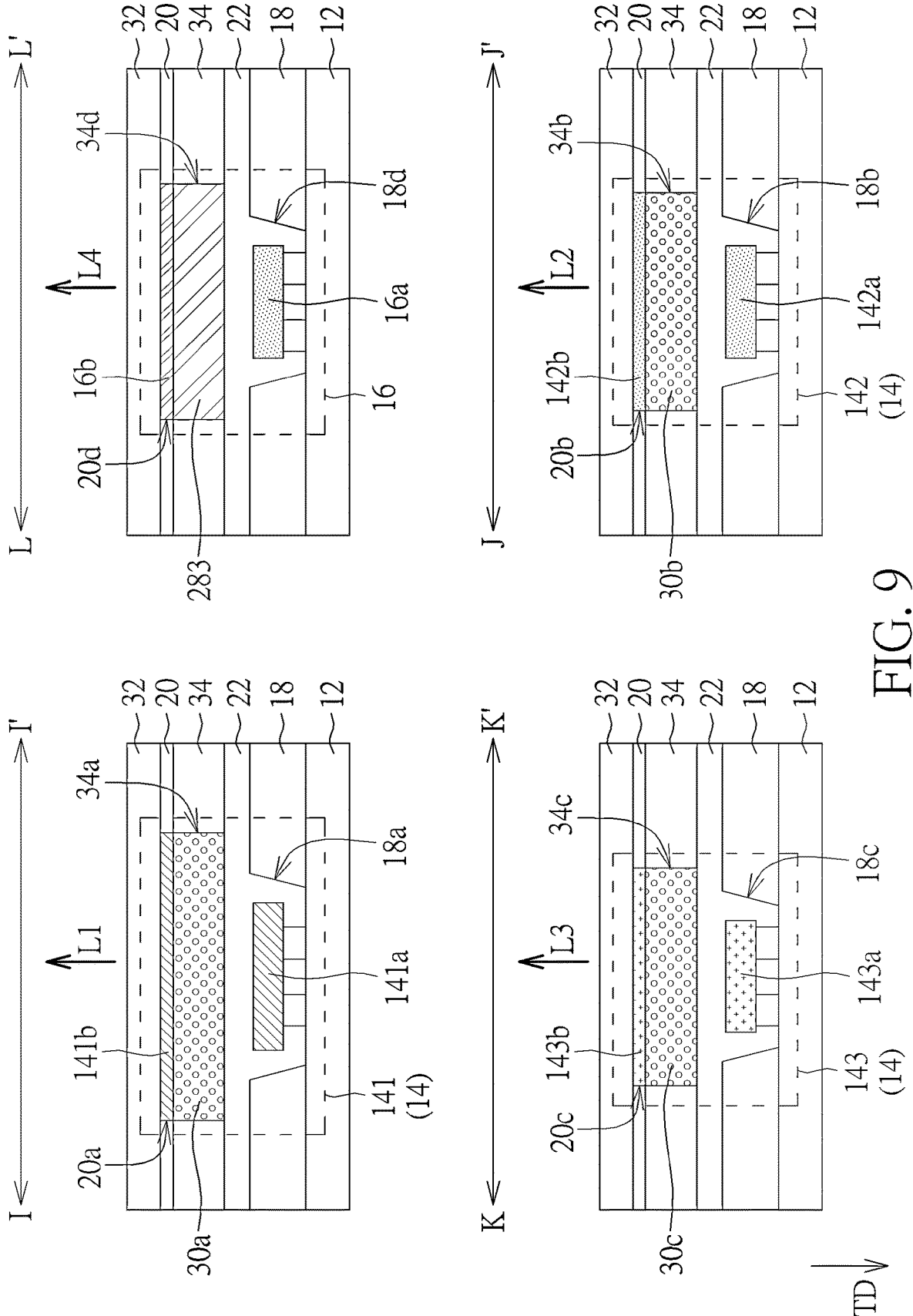
FIG. 9 schematically illustrates cross-sectional views of FIG. 8 taken along a sectional line I-I', a sectional line J-J', a sectional line K-K' and a sectional line L-L' respectively.

Refer to FIG. 8 and FIG. 9. FIG. 8 schematically illustrates a top view of a display device according to a fourth embodiment of the present disclosure, and FIG. 9 schematically illustrates cross-sectional views of FIG. 8 taken along a sectional line I-I', a sectional line J-J', a sectional line K-K', and a sectional line L-L'. As shown in FIG. 8 and FIG. 9, in the display device 4 provided in this embodiment, the first light emitting element 141a, the second light emitting element 142a, and the third light emitting element 143a may generate light of different colors, and the fourth light emitting element 16a may be the same as one of the first light emitting element 141a, the second light emitting element 142a, and the third light emitting element 143a. In this case, the invisible light display unit 16 further includes a third wavelength conversion layer 283 disposed on the fourth light emitting element 16a and configured to convert the visible light generated from the fourth light emitting element 16a into the invisible light L4. The structure of the third wavelength conversion layer 283 of this embodiment may be the same as the third wavelength conversion layer 283 of FIG. 7 and thus will not be described in detail here. In the embodiment of FIG. 9, the fourth light emitting element 16a and the second light emitting element 142a may be the same as each other and accordingly may generate light of the same color, but not limited thereto.

The first light emitting element 141a, the second light emitting element 142a, and the third light emitting element 143a of this embodiment may be, for example, the same as the first light emitting element 141a, the second light emitting element 142a, and the third light emitting element 143a of FIG. 2 respectively, and therefore will not be described herein. In some embodiments, the first visible light display unit 141 may optionally include a first light scattering layer 30a disposed on the first light emitting element 141a; the second visible light display unit 142 may optionally include a second light scattering layer 30b disposed on the second light emitting element 142a; and the third visible light display unit 143 may optionally include a third light scattering layer 30c disposed on the third light emitting element 143a. The first light scattering layer 30a, the second light scattering layer 30b and the third light scattering layer 30c may make the light L1 generated from the first visible light display unit 141, the light L2 generated from the second visible light display unit 142, and the light L3 generated from the third visible light display unit 143 respectively have greater beam angles, so as to increase the viewing angle of the display device 4. In some embodiments, the first light scattering layer 30a, the second light scattering layer 30b, and the third light scattering layer 30c may be formed of the same light scattering layer, but not limited thereto. The structures of the first light scattering layer 30a, the second light scattering layer 30b, and the third light scattering layer 30c may be the same as the light scattering layer 30 of FIG. 7 and will not be repeated herein.

In the embodiment of FIG. 8, the area of the first light emitting element 141a may be greater than the area of the second light emitting element 142a and the area of the third light emitting element 143a, so that the EQE of the first light emitting element 141a may be improved to reduce the overall power loss, or when the first light emitting element 141a requires a less chip size, the above configuration may improve the manufacturing yield of the first light emitting element 141a. Accordingly, the area of the first visible light display unit 141 may be greater than the area of the second visible light display unit 142 and the area of the third visible light display unit 143.

It should be noted that since the EQE of the second light emitting element 142a is greater than the EQE of the first light emitting element 141a, designing the fourth light emitting element 16a to be the same as the second light emitting element 142a facilitates increase of the EQE of the fourth light emitting element 16a. In this case, the area of the first light emitting element 141a may be greater than that of the fourth light emitting element 16a, so that the area of the first visible light display unit 141 may be greater than the area of the invisible light display unit 16. Furthermore, because a difference between the peak wavelength of the light generated from the second light emitting element 142a and the peak wavelength of the light L4 may be less than a difference between the peak wavelength of the light generated from the third light emitting element 143a and the peak wavelength of the light L4, the power loss resulted from converting the light of the fourth light emitting element 16a by the third wavelength conversion layer 283 may be reduced. In some embodiments, the fourth light emitting element 16a may be the same as the first light emitting element 141a or the third light emitting element 143a. Since the fourth light emitting element 16a is the same as one of the first light emitting element 141a, the second light emitting element 142a, and the third light emitting element 143a, the number of performing the mass transferring process may be reduced to simplify the manufacturing steps during disposing the first light emitting element 141a, the second light emitting element 142a, the third light emitting element 143a and the fourth light emitting element 16a in the opening 18a, the opening 18b, the opening 18c and the opening 18d. In addition, other portions of the display device 4 of FIG. 8 and FIG. 9 may be the same or similar to any one of the display devices of the above embodiments and will not be described again.

Figure 10:
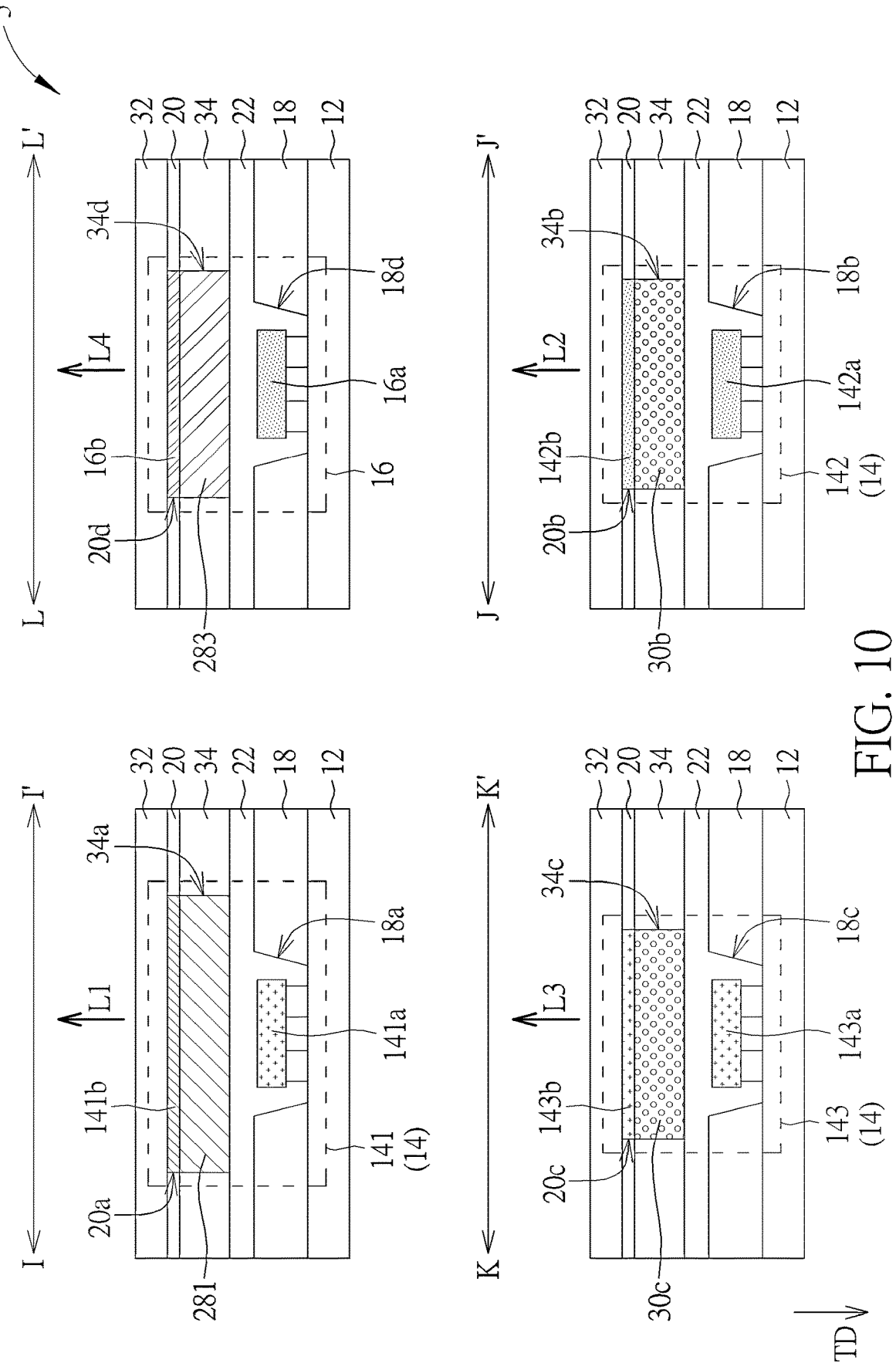
FIG. 10 schematically illustrates cross-sectional views of portions of a display device respectively corresponding to the sectional line I-I', the sectional line J-J', the sectional line K-K' and the sectional line L-L' of FIG. 8 according to a fifth embodiment of the present disclosure.

Refer to FIG. 10, which schematically illustrates cross-sectional views of portions of a display device respectively corresponding to the sectional line I-I', the sectional line J-J', the sectional line K-K', and the sectional line L-L' of FIG. 8 according to a fifth embodiment of the present disclosure. As shown in FIG. 10, in the display device 5 provided in this embodiment, the first light emitting element 141*a* is the same as one of the second light emitting element 142*a* and the third light emitting element 143*a* and configured to generating light of the same color. Also, the fourth light emitting element 16*a* may be the same as one of the first light emitting element 141*a*, the second light emitting element 142*a*, and the third light emitting element 143*a* and used to generate another light of the same color. In this case, the first visible light display unit 141 may further include the first wavelength conversion layer 281 disposed on the first light emitting element 141*a* and configured to convert the light from the first light emitting element 141*a* into the light L1. Moreover, the invisible light display unit 16 may further include a third wavelength conversion layer 283 disposed on the fourth light emitting element 16*a* and configured to convert the visible light generated from the fourth light emitting element 16*a* into the invisible light L4. The first light emitting element 141*a* and the first wavelength conversion layer 281 of this embodiment may respectively be the same as or similar to the first light emitting element 141*a* and the first wavelength conversion layer 281 of FIG. 7 and thus will not be described herein.

In the embodiment of FIG. 10, the fourth light emitting element 16*a* and the second light emitting element 142*a* may be the same as each other, so as to generate light of the same color. It should be noted that the EQE of the second light emitting element 142*a* may be greater than the EQE of the light emitting element that generates red light, so that the EQE of the fourth light emitting element 16*a* may be greater than the EQE of the light emitting element that generates red light. In such case, the overall power loss of the display device 5 may be reduced. Furthermore, a difference between the peak wavelength of the light generated from the second light emitting element 142*a* and the peak wavelength of the light L4 is less than a difference between the peak wavelength of the light generated from the third light emitting element 143*a* and the peak wavelength of the light L4, so that the power loss of converting the light of the fourth light emitting element 16*a* into the light L4 by the third wavelength conversion layer 283 may be reduced. In some embodiments, the fourth light emitting element 16*a* may be the same as the third light emitting element 143*a*. Since the fourth light emitting element 16*a* is the same as one of the second light emitting element 142*a* and the third light emitting element 143*a*, the number of performing the mass transferring process may be reduced to simplify the manufacturing steps during disposing the first light emitting element 141*a*, the second light emitting element 142*a*, the third light emitting element 143*a*, and the fourth light emitting element 16*a* in the opening 18*a*, the opening 18*b*, the opening 18*c*, and the opening 18*d* respectively.

It should be noted that since the first light emitting element 141*a* may be the same as the third light emitting element 143*a* in this embodiment, the EQE of the first light emitting element 141*a* may be improved as compared to the first light emitting element that generates red light. Also, during disposing the first light emitting element 141*a*, the second light emitting element 142*a*, the third light emitting element 143*a* and the fourth light emitting element 16*a* in the opening 18*a*, the opening 18*b*, the opening 18*c*, and the opening 18*d*, the number of performing the mass transfer process may be reduced to simplify the manufacturing steps. In addition, other portions of the display device 5 of FIG. 10 may be the same or similar to any one of the display devices of the above embodiments and will not be described again.

Refer to FIG. 11, which schematically illustrates a top view of a display device according to a sixth embodiment of the present disclosure. As shown in FIG. 11, in the display device 6 of this embodiment, a distribution density of the pixels PX may be greater than a distribution density of the invisible light display units 16. In one of the pixels PX as illustrated in FIG. 6, the first visible light display unit 141, the second visible light display unit 142, and the third visible light display unit 143 may be arranged in the same direction, but not limited thereto. In other words, the visible light image displayed by the display device 6 may have a higher resolution than the invisible light image displayed by the display device 6 in this embodiment. By reducing the distribution density of the invisible light display units 16, the area of the opening (e.g., the opening 20*d* shown in FIG. 2, FIG. 7, FIG. 9 or FIG. 10) of the light shielding layer 20 corresponding to the invisible light display unit 16 may be reduced, such that the reflectivity of the display device 6 to ambient light may be reduced.

Figure 12:
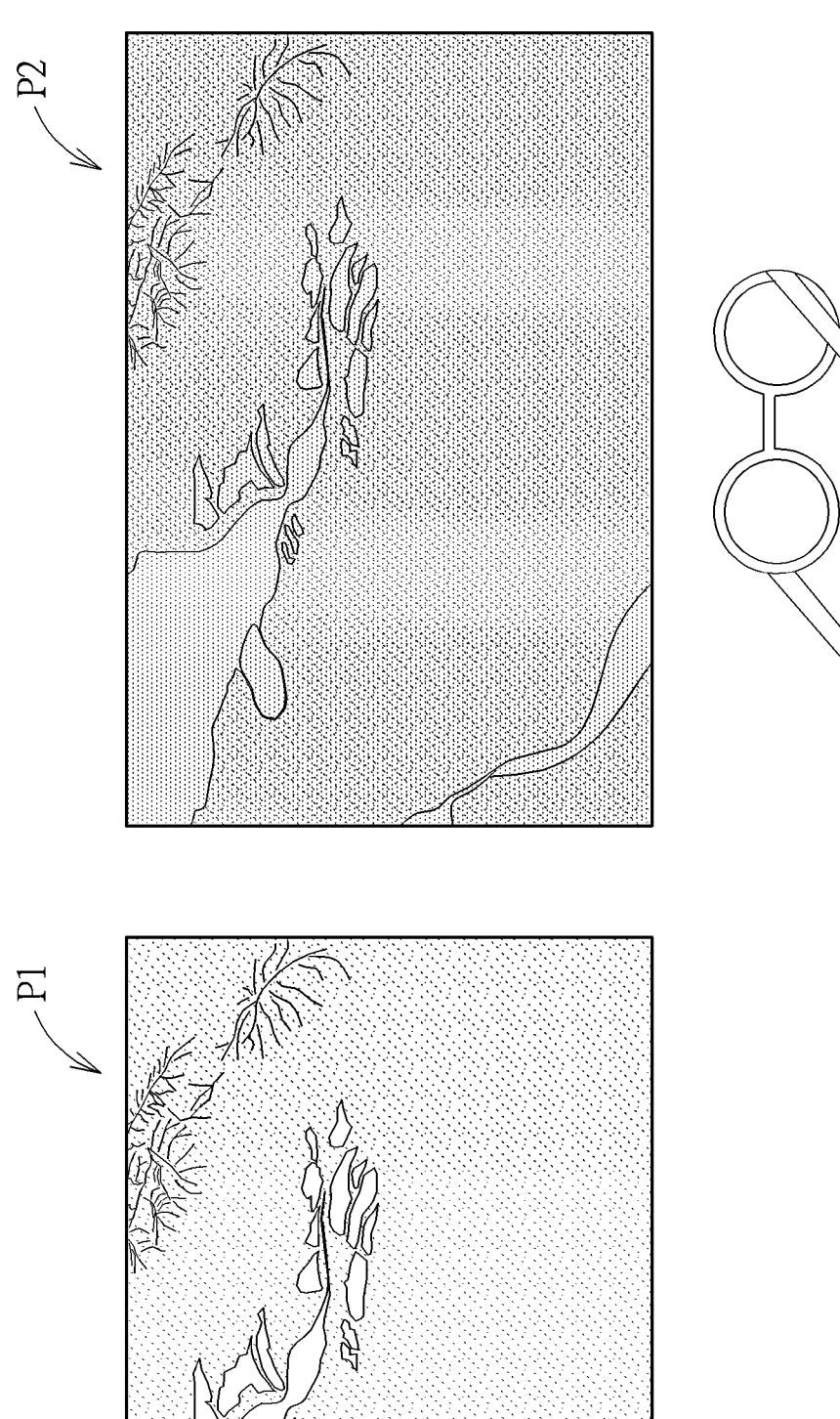
FIG. 12 schematically illustrates a display device operated in a normal mode and a night vision mode according to an embodiment of the present disclosure.

Following contents further describe a method for operating the display device. Refer to FIG. 12 together with FIG. 1. FIG. 12 schematically illustrates a display device operated in a normal mode and a night vision mode according to an embodiment of the present disclosure. As shown in FIG. 1 and FIG. 12, the method for operating the display device provided in this embodiment may include driving the visible light display units 14 and turning off the invisible light display units 16 in the normal mode, and driving the invisible light display units 16 and turning off the visible light display units 14 in the night vision mode. The display device 1 as illustrated in FIG. 1 is as an example of the display device of this embodiment for description, but not limited thereto. In some embodiments, the method for operating the display device herein may be applied to any one of the display devices of the other embodiments described above.

As shown in FIG. 1 and FIG. 12, in the night vision mode, the invisible light display units 16 display the invisible light image P2, and the visible light display units 14 are turned off, so that the display device 1 does not generate visible light in the night vision mode. In this way, bystanders who are not using the display device 1 will not find that the display device 1 is operating or displaying images, so that the display device 1 may have privacy. In a dark environment, the invisible light image P2 generated by the display device 1 is unable to be recognized by eyes, so that the position of the user will not be exposed. Accordingly, the user may view the image information while maintaining secrecy. In the present disclosure, when the display device 1 displays the invisible light image P2, the user needs to wear a device capable of viewing the invisible light image P2, such as a night vision device 100 or other suitable devices. In the normal mode, the visible light display units 14 display the visible light image P1, and the invisible light display units 16 are turned off, so that the display device 1 may display a general visible image in the normal mode. Taking military applications as an example, the display device 1 may be operated in the normal mode during the day to display the visible light image P1 and be operated in the night vision mode at night to display the invisible light image P2, thereby avoiding exposing the user's position.

In some embodiments, as shown in FIG. 1 and FIG. 12, the display device 1 may further include a hybrid mode. In the hybrid mode, the visible light display units 14 are driven, and the invisible light display units 16 are driven, such that the display device 1 may display the visible light image P1 and the invisible light image P2 at the same time. In the hybrid mode, the visible light display units 14 may display a first content, and the invisible light display unit 16 may display a second content, in which the first content may be the same as the second content. For example, the display device 1 may have a signal input source electrically connected to the visible light display units 14 and the invisible light display units 16 and configured to provide the same content to the visible light display units 14 and the invisible light display units 16, such that the first content of the visible light image P1 may be the same as the second content of the invisible light image P2, but not limited thereto. The first content and the second content may include, for example, patterns, grayscales or other content signals. Taking the military applications as an example, when a briefing is conducted at night, since it is inconvenient to put on and take off the night vision device 100, to display the visible light image P1 and the invisible light image P2 at the same time through the display device 1 helps a user who does not wear the night vision devices 100 and another user who wears the night vision devices 100 to view the same content at the same time.

Figure 13:
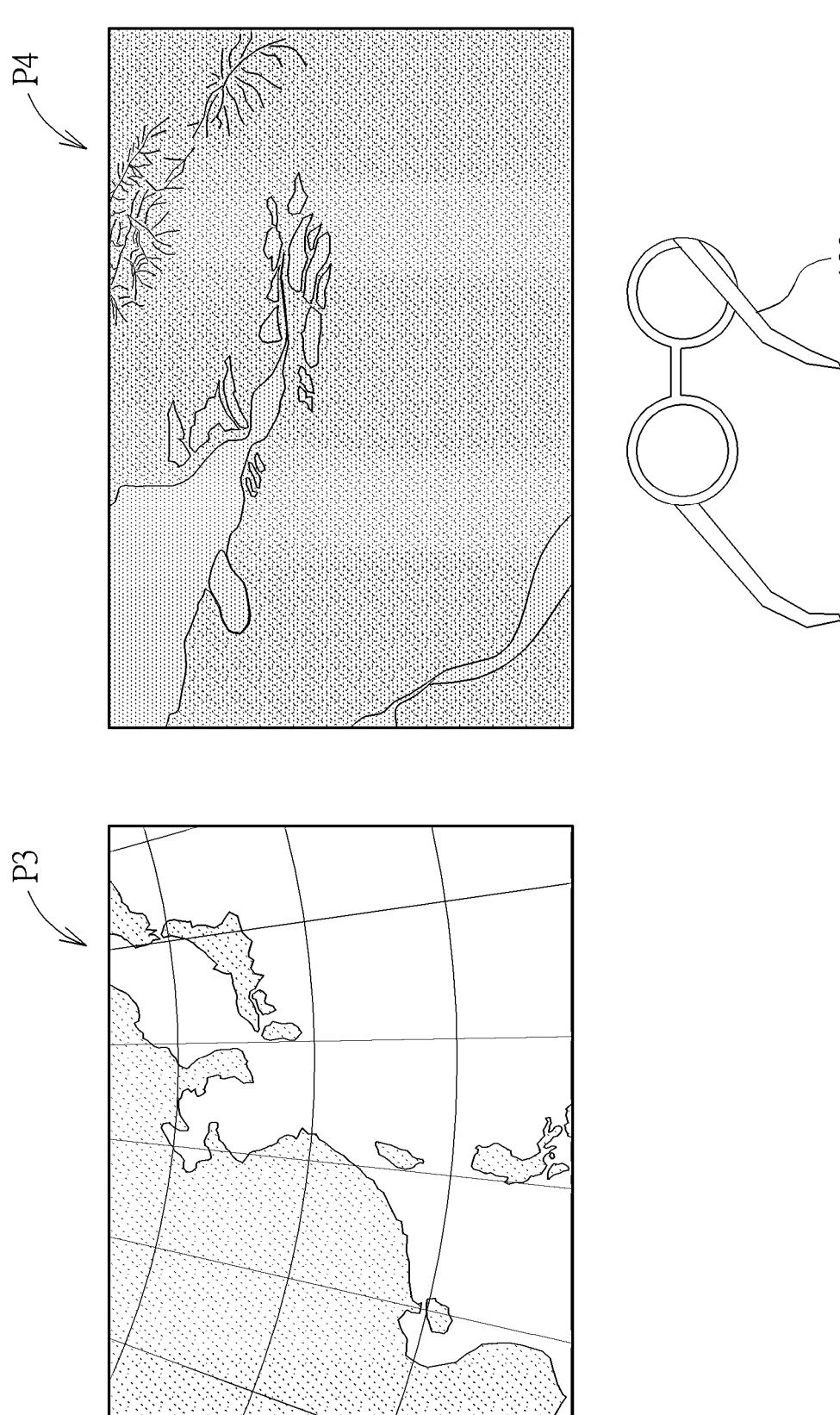
FIG. 13 schematically illustrates a display device operated in a privacy mode according to an embodiment of the present disclosure.

Refer to FIG. 13, which schematically illustrates a display device operated in a privacy mode according to an embodiment of the present disclosure. As shown in FIG. 13, the display device provided in this embodiment may further include a privacy mode, and a method for operating the display device may further include driving the visible light display units 14 to display a first content and driving the invisible light display units 16 to display a second content in the privacy mode, in which the first content is different from the second content. The display device 1 as illustrated in FIG. 1 is as an example of the display device of this embodiment for description, but not limited thereto. In some embodiments, the method for operating the display device herein may be applied to any one of the display devices of the other embodiments described above. For example, the display device 1 may have two signal input sources electrically connected to the visible light display units 14 and the invisible light display units 16, such that the two signal input sources may provide separate and different contents to the visible light display units 14 and the invisible light display units 16, respectively. Accordingly, the first content of the visible light image P3 may be different from the second content of the invisible light image P4, but not limited thereto. The first content and the second content may, for example, include patterns, gray scales or other content signals. In an example of the military application, to display the first content and the second content different from each other at the same time by the display device 1 may separate the information viewed by a user who wears the night vision devices 100 from the information viewed by another user who does not wear the night vision devices 100. For example, the first content of the visible light is not private, but the second content of the invisible light is private and is only allowed to be viewed by the user who wears the night vision devices 100. In some embodiments, the size of the first content may optionally be different from the size of the second content.

In summary, in the display device of the present disclosure, since it contains the visible light display units and the invisible light display units, the visible light image and the invisible light image may be displayed at the same time or not simultaneously, so that the display device may have the normal mode, the night vision mode, the hybrid mode, and the privacy mode. In the method for operating the display device of the present disclosure, since the displayed invisible light image needs to be matched with a specific viewing device, the bystander who is not using the display device will not recognize that the display device is operating or displaying images. Accordingly, the display device may have privacy. In the dark environment, the invisible light image generated by the display device is unable to be viewed by eyes, so that the position of the user will not be exposed, and the user may view the image information while maintaining secrecy.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
a substrate;
a plurality of visible light display units disposed on the substrate, wherein the plurality of visible light display units are configured to display a visible image, the plurality of visible light display units comprise a first visible light display unit, a second visible light display unit, and a third visible light display unit respectively configured to generate light of different colors, the first visible light display unit comprises a first light emitting element, the second visible light display unit comprises a second light emitting element, and the third visible light display unit comprises a third light emitting element; and
a plurality of invisible light display units disposed on the substrate, wherein the plurality of invisible light display units are configured to display an invisible image, one of the plurality of invisible light display units comprises a fourth light emitting element, the display device has a display region, the plurality of visible light display units and the plurality of invisible light display units are disposed in the display region, and the display device comprises a night vision mode and a normal mode,
wherein in the night vision mode, the plurality of invisible light display units display the invisible image, and the plurality of visible light display units are turned off,
wherein in the normal mode, the plurality of visible light display units display the visible image, and the plurality of invisible light display units are turned off,
wherein the first light emitting element, the second light emitting element, and the third light emitting element generate light of different colors, respectively, the fourth light emitting element is the same as one of the first light emitting element, the second light emitting element, and the third light emitting element, and the one of the plurality of invisible light display units further comprises a wavelength conversion layer disposed on the fourth light emitting element,
wherein a peak wavelength of light generated from the first visible light display unit is greater than a peak wavelength of light generated from the second visible light display unit, the peak wavelength of light generated from the second visible light display unit is greater than a peak wavelength of light generated from the third visible light display unit, and an area of the first visible light display unit is greater than an area of the one of the plurality of invisible light display units.

2. The display device according to claim 1, wherein a peak wavelength of light generated from the first light emitting element is greater than a peak wavelength of light generated from the second light emitting element and a peak wavelength of light generated from the third light emitting element, and an area of the first light emitting element is greater than an area of the second light emitting element and an area of the third light emitting element.

3. The display device according to claim 1, wherein a peak wavelength of light generated from the fourth light emitting element is greater than a peak wavelength of light generated from the second light emitting element and a peak wavelength of light generated from the third light emitting element, and an area of the fourth light emitting element is greater than an area of the second light emitting element and an area of the third light emitting element.

4. The display device according to claim 1, wherein the first visible light display unit further comprises a first color filter layer disposed on the first light emitting element, the second visible light display unit further comprises a second color filter layer disposed on the second light emitting element, the third visible light display unit further comprises a third color filter layer disposed on the third light emitting element, the one of the plurality of invisible light display units further comprises a filter layer disposed on the fourth light emitting element, wherein the first color filter layer, the second color filter layer, the third color filter layer, and the filter layer have different transmission spectra.

5. The display device according to claim 1, wherein the fourth light emitting element is the same as the second light emitting element.

6. The display device according to claim 1, wherein the plurality of visible light display units form a plurality of pixels, and a distribution density of the plurality of pixels is greater than or equal to a distribution density of the plurality of invisible light display units.

7. A display device, comprising:
a substrate;
a plurality of visible light display units disposed on the substrate, wherein the plurality of visible light display units are configured to display a visible image, the plurality of visible light display units comprise a first visible light display unit, a second visible light display unit, and a third visible light display unit respectively configured to generate light of different colors, the first visible light display unit comprises a first light emitting element, the second visible light display unit comprises a second light emitting element, and the third visible light display unit comprises a third light emitting element; and
a plurality of invisible light display units disposed on the substrate, wherein the plurality of invisible light display units are configured to display an invisible image, one of the plurality of invisible light display units comprises a fourth light emitting element, the display device has a display region, the plurality of visible light display units and the plurality of invisible light display units are disposed in the display region, and the display device comprises a night vision mode and a normal mode,
wherein in the night vision mode, the plurality of invisible light display units display the invisible image, and the plurality of visible light display units are turned off,
wherein in the normal mode, the plurality of visible light display units display the visible image, and the plurality of invisible light display units are turned off,
wherein the first light emitting element, the second light emitting element, the third light emitting element, and the fourth light emitting element are the same, the first visible light display unit further comprises a first wavelength conversion layer disposed on the first light emitting element, the second visible light display unit further comprises a second wavelength conversion layer disposed on the second light emitting element, the one of the plurality of invisible light display unit further comprises a third wavelength conversion layer disposed on the fourth light emitting element, and the first wavelength conversion layer, the second wavelength conversion layer, and the third wavelength conversion layer are configured to generate light with different peak wavelengths, respectively,
wherein a peak wavelength of light generated from the first visible light display unit is greater than a peak wavelength of light generated from the second visible light display unit, the peak wavelength of light generated from the second visible light display unit is greater than a peak wavelength of light generated from the third visible light display unit, and an area of the second visible light display unit is greater than an area of the first visible light display unit.

* * * * *